United States Patent [19]

Ishikawa

[11] Patent Number: 5,633,208
[45] Date of Patent: May 27, 1997

[54] PLANARIZATION OF INSULATION FILM USING LOW WETTINGNESS SURFACE

[75] Inventor: Hiraku Ishikawa, Tokyo, Japan

[73] Assignee: NEC Corporation, Tokyo, Japan

[21] Appl. No.: 352,155

[22] Filed: Dec. 1, 1994

[30] Foreign Application Priority Data

Dec. 1, 1993 [JP] Japan .................... 5-301388

[51] Int. Cl.$^6$ .................................. H01L 21/465
[52] U.S. Cl. ............................ 438/699; 438/763
[58] Field of Search ........................ 437/228, 231, 437/238, 195

[56] References Cited

U.S. PATENT DOCUMENTS

| | | | |
|---|---|---|---|
| 4,676,867 | 6/1987 | Elkins et al. | 437/228 PL |
| 4,775,550 | 10/1988 | Chu et al. | 437/228 PL |
| 4,806,504 | 2/1989 | Cleeves | 437/228 PL |
| 4,894,351 | 1/1990 | Batty | 437/228 PL |
| 5,426,076 | 6/1995 | Moghadam | 437/238 |
| 5,508,233 | 4/1996 | Yost et al. | 437/195 |
| 5,514,616 | 5/1996 | Rostoker et al. | 437/228 |
| 5,514,624 | 5/1996 | Morozumi | 437/228 |

OTHER PUBLICATIONS by Takata, Y. et al., "A Highly Reliable Multilevel Interconnection Process for 0.6μm CMOS Devices", *VMIC Conference*, IEEE, Jun. 11–12, 1991, pp. 13–19.

*Primary Examiner*—John S. Chu
*Attorney, Agent, or Firm*—Young & Thompson

[57] ABSTRACT

A planarization method comprises forming on an uneven surface an silicon oxide film having a low wettingness at least on its surface. The low wettingness of the silicon oxide film is obtained by increasing the silicon/oxygen atom ratio by means of argon sputtering or plasma CVD method. A silica solution is subsequently spin-coated onto the silicon oxide film. Since the surface of the silicon oxide film has a low wettingness, more of the coated silica solution stands on recessed portions than on raised portions, resulting in a flat surface of the coated solution. After the coated silica solution has been hardened, etching-back can be carried out until the coated silica solution is completely removed, thereby achieving the planarized surface of the silicon oxide film.

11 Claims, 7 Drawing Sheets

CONVENTIONAL WETTINGNESS

LOWER WETTINGNESS

PLANARIZATION OF INSULATION FILM USING LOW WETTINGNESS SURFACE

BACKGROUND OF THE INVENTION

1. Field of the Invention

The present invention relates to the manufacture of a semiconductor device and, in particular, to a method for forming a planar insulation film on an uneven surface of a substrate on which elements and interconnections are formed.

2. Description of the Prior Art

With increasing semiconductor device density, the down scaling of transistors and metal interconnections is accelerated, and further demands are placed on multilayer structures. However, it is difficult for conventional manufacturing method using lithography technology to appropriately form a fine and multilayered interconnection structure. The reason is that the resolution required to miniaturize interconnection patterns is close to the limit of current lithography technology and the multilayering of interconnections generates an uneven surface which prevents forming fine patterns thereon.

A planarization process for removing steps from the surface of semiconductor devices in a multilayered structure has been proposed as a solution for the above-mentioned problem. For example, in the paper "A Highly Reliable Multilevel Interconnection Process for 0.6 μm CMOS Devices" (IEEE, Jun. 11–12, 1991, VMIC Conference, pp. 13 to 19), a multilayered interconnection structure can be formed using a planarization process based on Atmospheric Pressure Chemical Vapor Deposition (APCVD) using ozone and tetraethoxysilane (TEOS).

FIGS. 1A to 1D show a manufacturing method of a semiconductor device using a conventional planarization process. As shown in FIG. 1A, metal interconnection 1 is first formed on a semiconductor substrate 2 using lithography and dry etching methods. As shown in FIG. 1B, a silicon oxide film 3 is then deposited on both the interconnection sections and other surface of the substrate 2 using plasma CVD. As shown in FIG. 1C, a silicon oxide film 6 is deposited on the surface by means of APCVD using ozone and TEOS. Furthermore, as shown in FIG. 1D, the silicon oxide film 6 is dry-etched to form a silicon oxide film 6'. After dry-etching, a silicon oxide film 13 is formed on the exposed silicon oxide film 6' using plasma CVD. On the silicon oxide film 13, another interconnection for a second layer is formed in the same manner to form a multilayered structure.

However, such a conventional manufacturing method has the following disadvantages:

1) The method is complicated and requires many manufacturing steps;

2) It is virtually impossible to avoid differences in levels between a surface with interconnections having a large interval and other surface with interconnections having a small interval; and 3) Even after the planarization process, significant steps remain on the surface and the step amount increases with the number of layers formed.

Therefore, conventional methods can only produce a multilayered structure with a small number of layers.

SUMMARY OF THE INVENTION

It is an object of the present invention to provide an insulation film formation method enabling steps to be efficiently reduced.

It is another object of the present invention to provide a method for forming a planar insulation film on a surface with steps using a reduced number of manufacturing steps.

The present invention is based on the knowledge that a flat surface can be easily obtained by coating a solution on the surface having a low wettingness because most of the solution coated on the surface is deposited in valleys instead of on ridges. The wettingness can generally be expressed by means of a contact angle (see FIGS. 3A and 3B).

A planarization method in accordance with the present invention first forms on the major surface with steps an insulation film having low wettingness at least on its surface. At this point, the surface of the insulation film reflects the steps of the major surface. A solution mainly comprising the same components as the insulation film and having a hydrophilic radical is subsequently coated onto the insulation film. Since the surface of the insulation film has low wettingness, more of the coated solution is deposited on recessed sections than on raised sections, resulting in a flat surface of the coated solution. After the coated solution is hardened, etching-back can be carried out until the coated solution is completely removed, thereby easily achieving the planarized surface of the insulation film.

The insulation film formed on the major surface may be processed such that its wettingness can be reduced after it is formed using an ordinary deposition method. Alternatively, the insulation film may be deposited which has an insulation composition serving to reduce wettingness.

The insulation film is comprised of silicon oxide, and the coated solution is a silica solution with a hydrophilic property for spin-coating. The reduced wettingness of the surface of a silicon oxide film can be obtained by increasing the number of silicon atoms relative to ordinary silicon dioxide. One method for obtaining such a silicon oxide film is to perform sputtering with a rare gas such as argon on a deposited silicon dioxide film. Another method is to increase the flow rate of a silane gas when depositing a silicon oxide film by means of CVD using oxygen and silane gases.

DESCRIPTION OF THE PREFERRED EMBODIMENTS

Figure 1A:
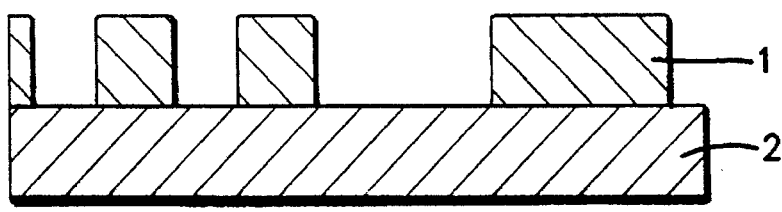
FIGS. 1A to 1E show an example of conventional planarization method for forming a flat insulation film on a semiconductor substrate with interconnections formed thereon.
Figure 1B:
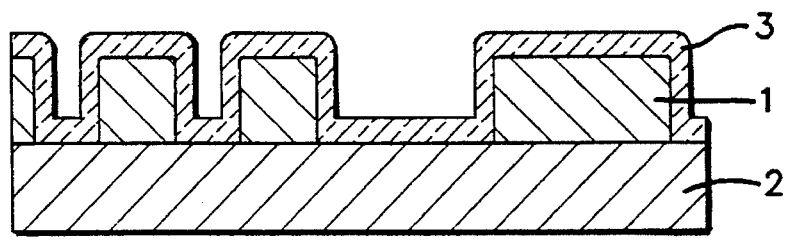
Figure 1C:
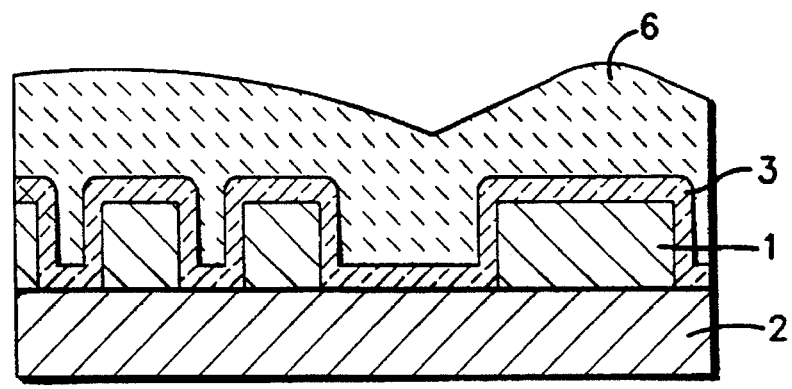
Figure 1D:
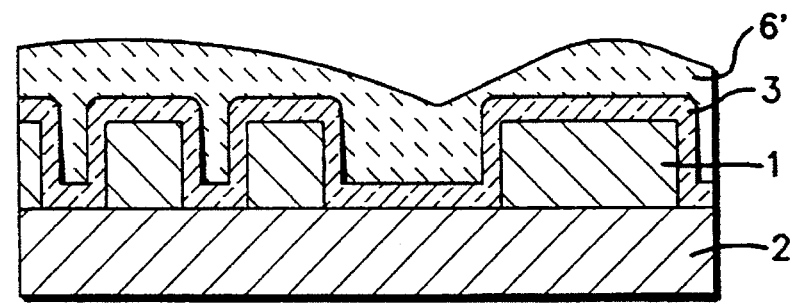
Figure 1E:
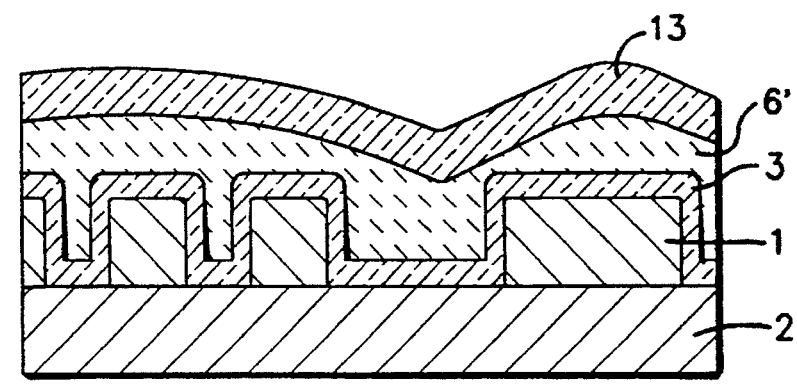
Figure 2A:
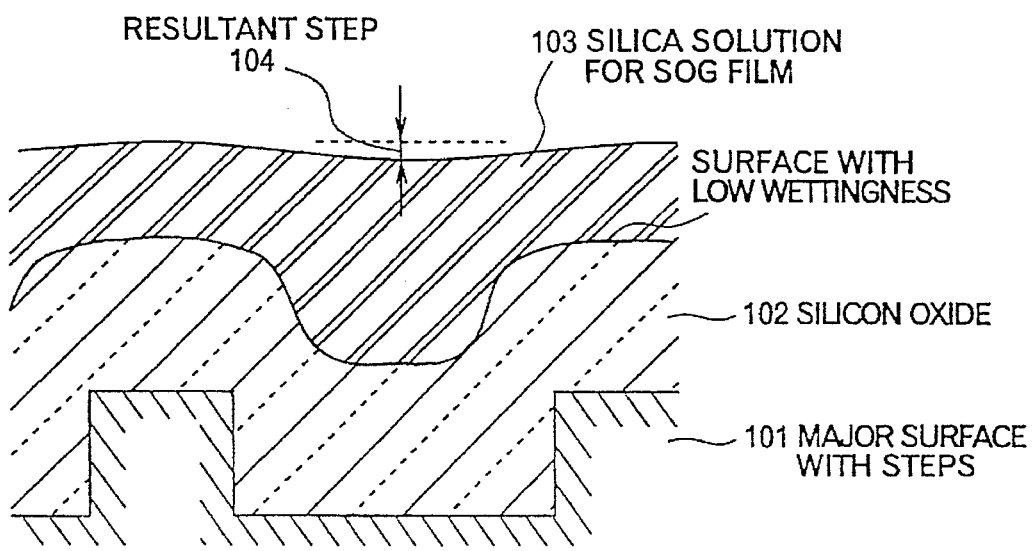
FIGS. 2A and 2B schematically show a first embodiment of an insulation planarization method in accordance with the present invention.

As illustrated in FIG. 2A, a silicon oxide film 102 is deposited by plasma CVD with a thickness greater than a step of an uneven surface 101. The silicon oxide film 102 has an uneven surface comprising recessed and raised sections reflecting the steps on the major surface 101.

A rare gas such as argon is sputtered on the silicon oxide film 102 to remove oxygen atoms, which causes the silicon/oxygen atom ratio to be increased, resulting in the decreased wettingness of the silicon oxide film 102.

Instead of the use of sputtering, deposition conditions for electron cyclotron resonance (ECR) plasma CVD may be varied to obtain low wettingness of the silicon oxide film 102. To deposit a silicon oxide film 102 using ECR plasma CVD, the silane/oxygen gas flow ratio must be higher than 0.67. This allows the atom ratio of silicon to oxygen in the silicon oxide film 102 to be greater than that in ideal $SiO_2$. It is possible to deposit the silicon oxide film 102 having excess silicon atoms only in the surface of the silicon oxide film 102 by adjusting the silane/oxygen gas flow ratio according to the growth of the film.

A silica solution 103 is subsequently spin-coated on the silicon oxide film 102 and hardened to form a spin-on-glass (SOG) film. The silica solution 103 is an organic or an inorganic solution with a hydrophilic radical mainly comprising $Si(OH)_4$ or $R_n$—$Si(OH)_{4-n}$, wherein Rn is hydrocarbon or an alkyl group. As described above, since the surface of the silicon oxide film 102 has low wettingness (or a large contact angle), more of the silica solution 103 stands on recessed portions and the surface of the silica solution 103 is flattened. Only a negligibly small step 104 remains in the recessed sections.

Figure 2B:
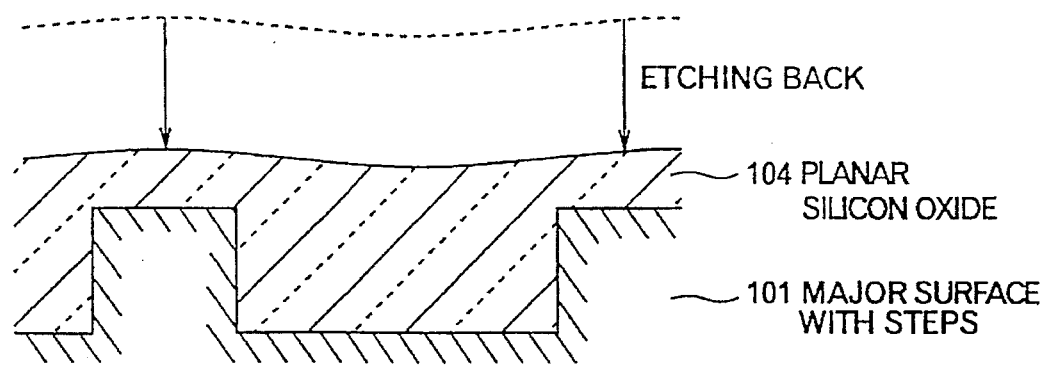

As shown in FIG. 2B, after such a SOG film is formed, its overall surface is etched back by means of dry etching method until the SOG film is removed, thereby forming a silicon oxide film 104 with an approximately planar surface corresponding to the contour of the SOG film.

Figure 3A:
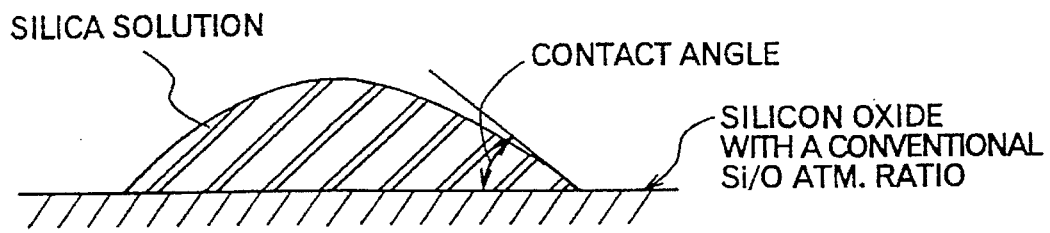
FIG. 3A shows a contact angle when a silica solution is dropped onto a conventional insulation film.
Figure 3B:
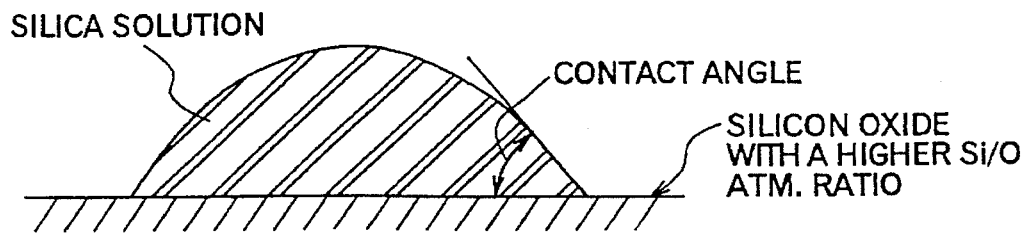
FIG. 3B shows a contact angle when a silica solution is dropped onto the insulation film in the first embodiment.

In general, the wettingness of the surface of a solid is measured using a contact angle. FIGS. 3A and 3B show the wettingness of a conventional silicon oxide film and the wettingness of silicon oxide film in accordance with this invention, respectively.

In FIG. 3A, when a silica solution is dropped onto the surface of the silicon dioxide film ($SiO_2$), they spread over the surface to form a small contact angle.

However, the silicon oxide film in accordance with this invention contains more silicon atoms at least on its surface, a dropped silica solution is repelled, forming a large contact angle, as shown in FIG. 3B. In other words, the silicon oxide film in accordance with this invention has low wettingness. In this way, the wettingness of a silicon oxide film and a liquid can be actually measured using the contact angle.

Next, a second embodiment of this invention using a sputtering method is described below.

Figure 4:
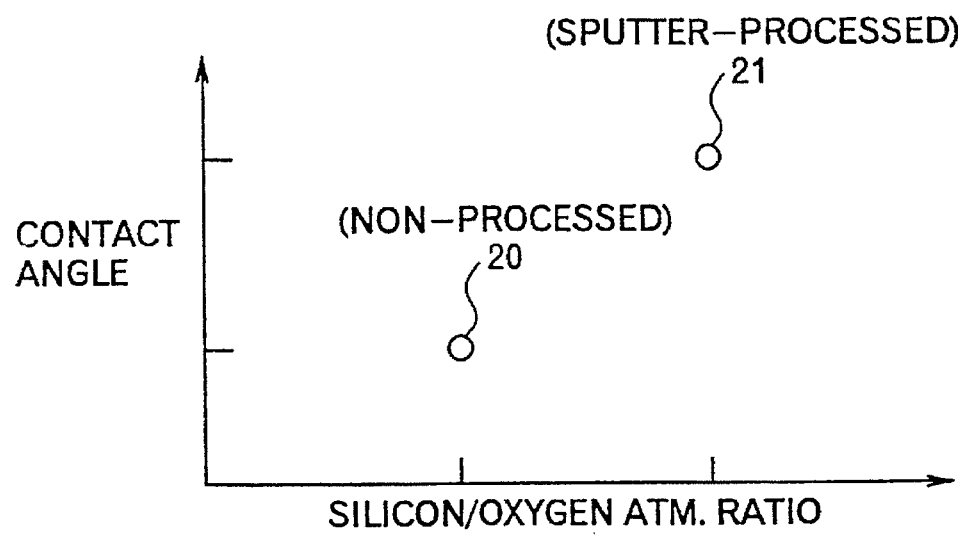
FIG. 4 is a graph showing changes in the contact angle versus silicon/oxygen atom ratio for the surface of a silicon oxide film.

As shown in FIG. 4, with increasing in the number of silicon atoms on the surface of the silicon oxide film, the contact angle increases, that is, the wettingness decreases. In this figure, an unprocessed silicon oxide film ($SiO_2$) indicated by reference numeral 20 is compared to a silicon oxide film (reference numeral 21) sputtered with argon. The use of sputtering increases the silicon/oxygen atom ratio and thus contact angle of the surface of a silicon oxide film. Under conditions such that argon is used as a rare gas for sputtering and the processing pressure is 4 mTorr, the RF power 600 W, and the processing time 10 seconds, a sputter-processed silicon oxide film has a contact angle three times greater than a unprocessed silicon oxide film.

Figure 5A:
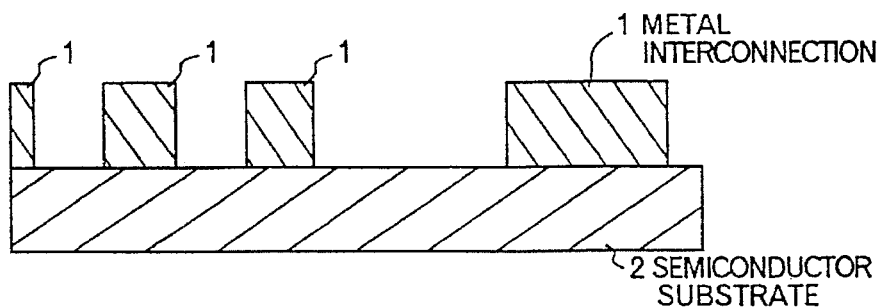
FIGS. 5A to 5E show a process for forming a planar insulation film on a semiconductor substrate with interconnection formed thereon in accordance with a second embodiment of this invention.
Figure 5B:
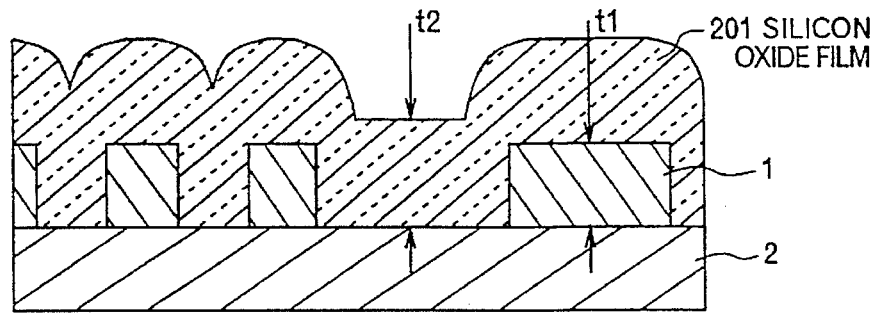

As illustrated in FIG. 5A, metal interconnections 1 with thickness t1 are first formed on a semiconductor substrate 2 using lithography and dry etching techniques. Plasma CVD is then used to form a silicon oxide film 201 with a thick-ness t2 which is, greater than the thickness of the interconnections 1 (FIG. 5B).

Figure 5C:
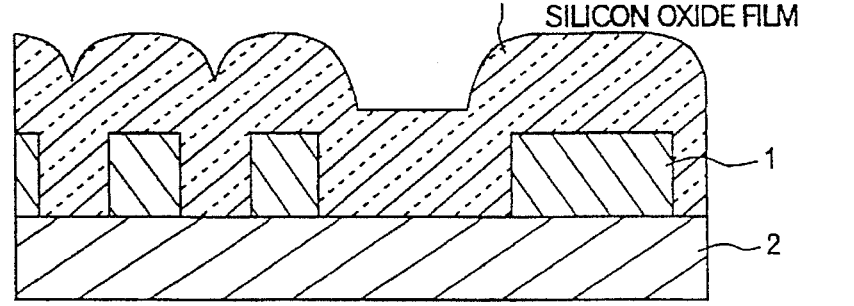

An argon gas is subsequently sputtered on the silicon oxide film 201 for ten seconds. In this case, the processing pressure and the RF power are 4 mTorr and 600 W, respectively. This sputtering process causes the silicon/oxygen atom ratio on the surface of the silicon oxide film 201 to be increased. Therefore, the silicon oxide film 201 becomes a silicon oxide film 201S having a large contact angle on the surface thereof, that is, a low wettingness (FIG. 5C).

Figure 5D:
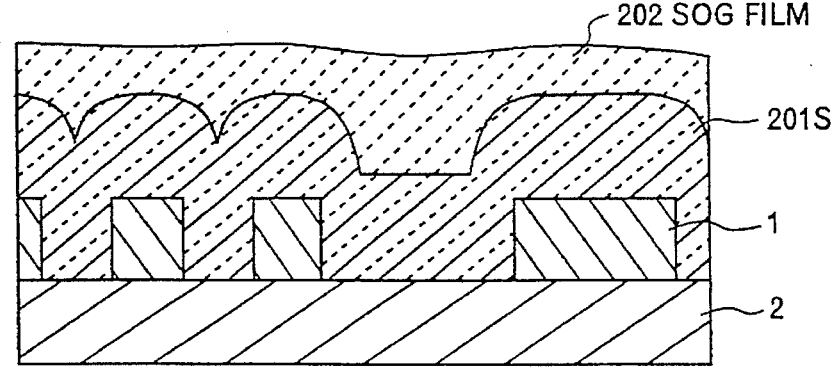

A silicon solution is subsequently spin-coated on the silicon oxide film 201S having a large contact angle, and left as it is in a nitrogen atmosphere at 400° C. for 30 minutes. The solution is then hardened to form an SOG film 202 (FIG. 5D). The SOG film 202 has a substantially planar surface as described above.

Figure 5E:
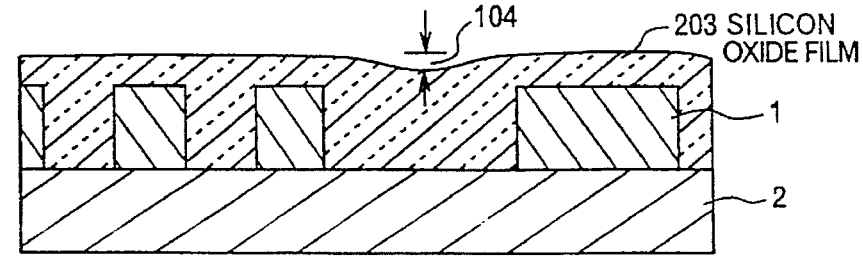

The overall surface is etched back by means of dry etching until the SOG film 202 is completely removed, thereby forming a planar silicon oxide film 203 corresponding to the contour of the SOG film 202 (FIG. 5E). Since the SOG film 202 generally has a poor quality, it must be completely removed so as not to deteriorate the reliability of the semiconductor device.

Figure 6:
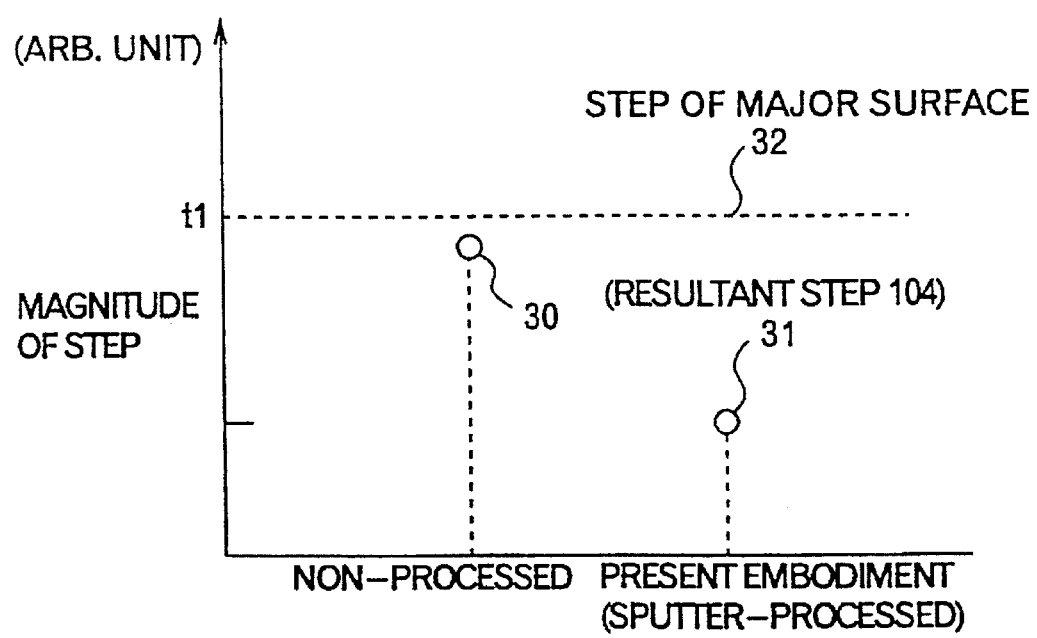
FIG. 6 is a graph showing the magnitude of steps after planarizing in the second embodiment and that in a conventional example.

As shown in FIG. 6, the sputtered silicon oxide film 201S (indicated by reference numeral 31) has much smaller steps than the unprocessed film (indicated by reference numeral 30). For example, if the width of an interconnection and the distance between interconnections of FIG. 6A are 30 μm, planarization of the sputtered silicon oxide film 201S results in a half or less magnitude of steps compared with planarization of the unprocessed film.

Next, a third embodiment of this invention using ECR plasma CVD will be described.

Figure 7:
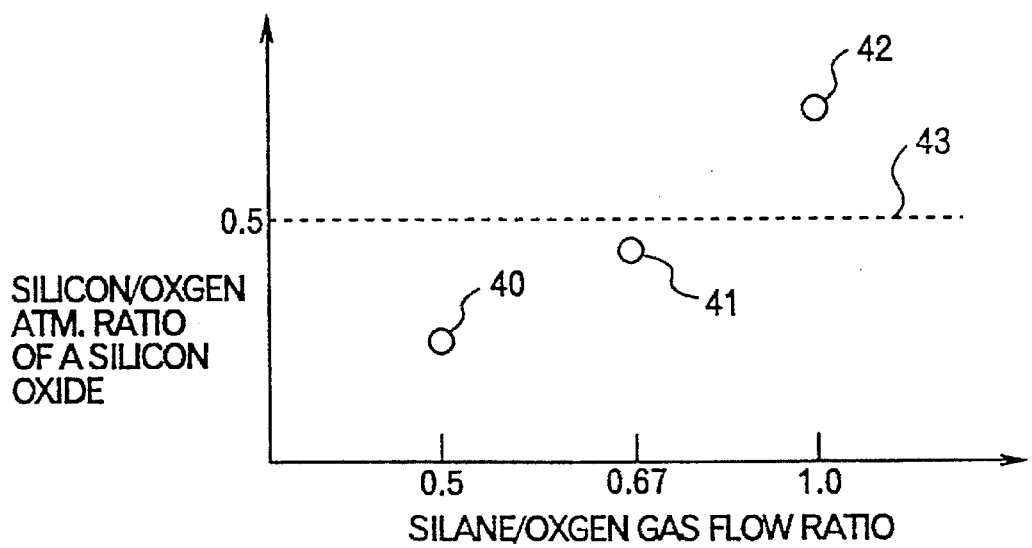
FIG. 7 is a graph showing changes in the silicon/oxygen atm. ratio versus silane/oxygen gas flow ratio in ECR plasma CVD.

When a silicon oxide film is deposited using ECR plasma CVD, the silicon/oxygen atom ratio of a silicon oxygen film to be deposited can be changed by varying the flow rate ratio of material gases, as shown in FIG. 7. The condition of ECR plasma CVD is as follows: the flow rate of an argon gas, 80 sccm; the microwave power, 2000 W; the bias power, 1400 W; a substrate temperature, 80° C.; and a pressure during deposition, 1.5 mTorr. When the silane/oxygen gas flow rate ratio is set to 0.67 or less under these conditions, the silicon/oxygen atom ratio becomes less than 0.5 as indicated by reference numerals 40 and 41 in FIG. 7. Since silicon dioxide stoichiometrically has a silicon/oxygen atom ratio of 0.5 (reference numeral 43), the silane/oxygen gas flow rate ratio of 0.67 or less causes the contact angle to be decreased and the effects of this invention cannot be adequately acquired. If the silane/oxygen gas flow rate ratio is more than 0.67, the silicon/oxygen atom ratio will be more than 0.5, resulting in a large contact angle of the silicon oxide film (reference numeral 42).

Figure 8A:
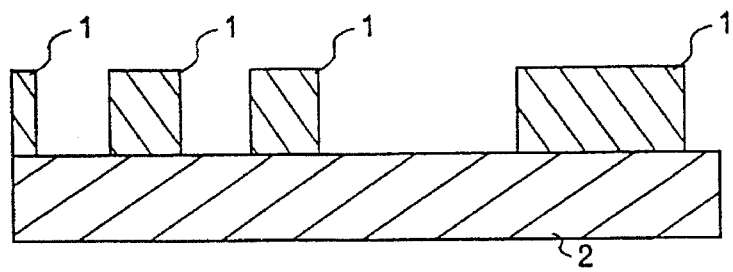
FIG. 8A to 8D show a process for forming a flat insulation film on a semiconductor substrate with interconnection formed thereon in accordance with the second embodiment of this invention.
Figure 8B:
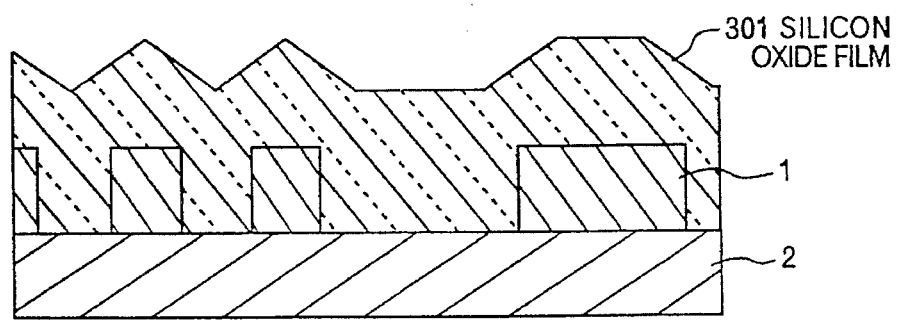

First of all, as illustrated in FIG. 8A, a metal interconnections 1 are formed on a semiconductor substrate 2 using lithography and dry etching methods. On the interconnections 1 and the substrate 2, a silicon oxide film 301 having a thickness greater than the interconnection 1 is deposited by an ECR plasma CVD technique (FIG. 8B). As described above, it is important to deposit the silicon oxide film 301 with a large contact angle by using a silane/oxygen gas flow rate ratio greater than 0.67. Changing the flow rate ratio of silane and oxygen gases with growing of the silicon oxide film, only a surface layer can be provided with a large contact angle. However, the overall silicon oxide film 301 may be of a meterial having a large contact angle.

Figure 8C:
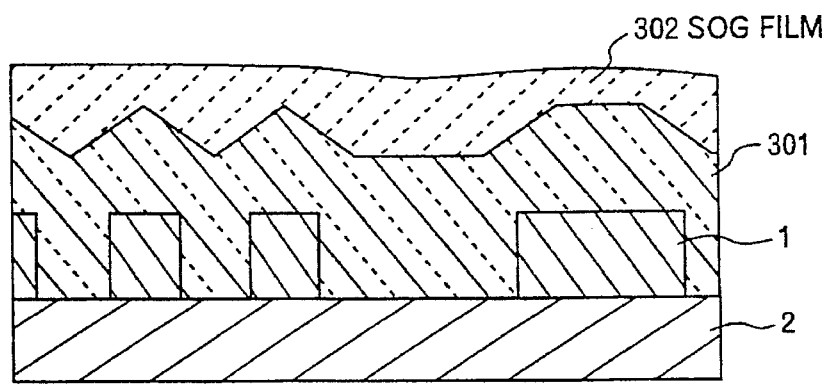

A silica solution is subsequently spin-coated on the silicon oxide film 301 having a surface with a large contact angle and then is hardened to form an SOG film 302 (FIG. 8C). The SOG film 302 is substantially planar as described above.

Figure 8D:
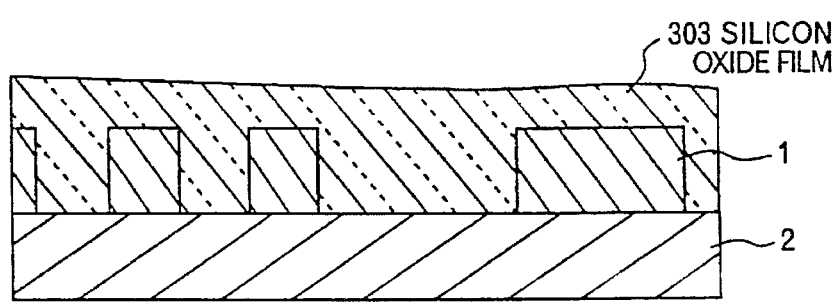

Next, the overall surface is etched back by means of dry etching until the SOG film 302 is completely removed, thereby forming a planar silicon oxide film 303 corresponding to the contour of the SOG film 302 (FIG. 8D).

Figure 9:
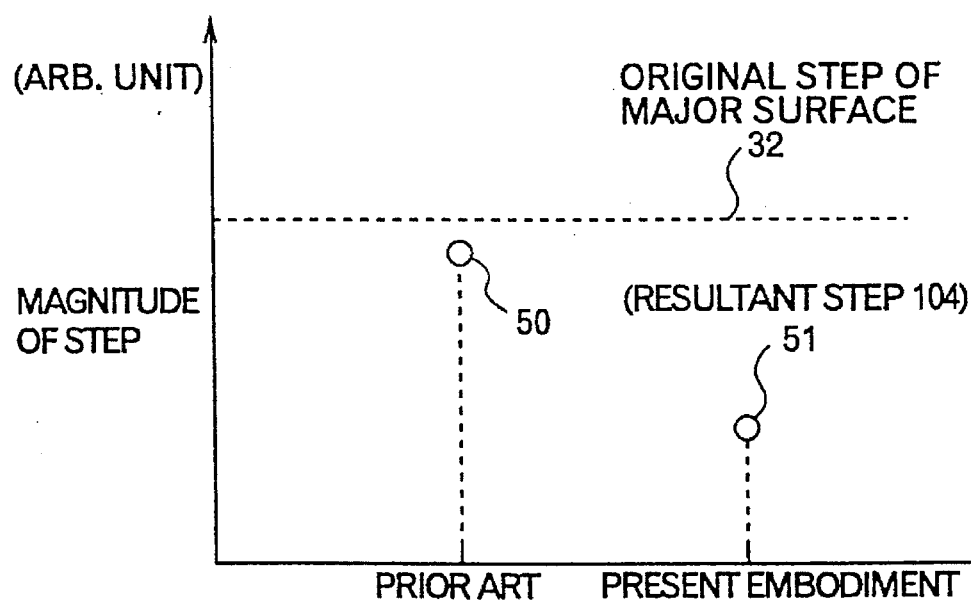
FIG. 9 is a graph showing the magnitude of steps after planarizing in a conventional example and that in the second embodiment.

As shown in FIG. 9, the size of a step on the silicon oxide film 303 obtained in this manner (reference numeral 51) is one-third as small as that of a step in the prior art (reference numeral 50).

As described above, according to the present invention, planarization of an insulation film having an uneven surface can be easily achieved by reducing wettingness on a major surface of the insulation film, coating a hydrophilic hardenable solution thereon, and then etching back.

What is claimed is:

1. A method for planarizing an insulation film formed on an uneven surface, comprising:

a first step of forming said insulation film on said uneven surface, said insulation film having a lowered wettingness at least on a surface of said insulation film;

a second step of coating a hydrophilic hardenable solution on said insulation film formed by the first step;

a third step of hardening said hydrophilic hardenable solution to form a hardened film on said insulation film; and a fourth step of etching back said hardened film toward said insulation film.

2. The method according to claim 1, wherein said first step comprises:

forming said insulation film on said uneven surface; and changing a material composition of said insulation film on its surface to lower said wettingness.

3. The method according to claim 1, wherein the first step comprises depositing said insulation film having a material composition serving to lower said wettingness.

4. The method according to claim 1, wherein the second step comprises spin-coating said hydrophilic hardenable solution.

5. The method according to claim 1, wherein said insulation film has a thickness greater than an elevation of said uneven surface.

6. A method for planarizing an insulation film formed on an uneven surface, comprising:

a first step of forming a silicon oxide film on said uneven surface, said silicon oxide film having a lowered wettingness at least on the surface of said silicon oxide film;

a second step of coating a hydrophilic silica solution on said silicon oxide film;

a third step of hardening said silica solution to form a hardened film on said silicon oxide film; and a fourth step of etching back said hardened film toward said silicon oxide film until said hardened film is completely removed.

7. The method according to claim 6, wherein said silicon oxide film formed by said first step has a silicon/oxygen atom ratio greater than 0.5 at least on said surface of said silicon oxide film.

8. The method according to claim 7, wherein said first step comprises:

forming a silicon dioxide film on said uneven surface; and sputtering a rare gas on said silicon dioxide film.

9. The method according to claim 7, wherein said first step comprises depositing said silicon oxide film using a chemical vapor deposition process in which a silane/oxygen gas flow rate ratio is set to more than 0.67.

10. The method according to claim 6, wherein said second step comprises spin-coating said silica solution.

11. The method according to claim 6, wherein said silicon oxide film has a thickness greater than an elevation of said uneven surface.

\* \* \* \* \*